United States Patent
Poplingher et al.

(10) Patent No.: US 6,173,379 B1
(45) Date of Patent: *Jan. 9, 2001

(54) MEMORY DEVICE FOR A MICROPROCESSOR REGISTER FILE HAVING A POWER MANAGEMENT SCHEME AND METHOD FOR COPYING INFORMATION BETWEEN MEMORY SUB-CELLS IN A SINGLE CLOCK CYCLE

(75) Inventors: Mircea Poplingher, Campbell; Wenliang Chen, Sunnyvale; Ganesh Suryanarayanan, Santa Clara; Wayne W. Chen; Roger Y. Lo, both of San Jose, all of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/645,653

(22) Filed: May 14, 1996

(51) Int. Cl.[7] .................... G06F 13/00; G11C 11/413
(52) U.S. Cl. .................. 711/165; 711/5; 713/320; 712/233; 365/230.03; 365/227
(58) Field of Search .................... 395/431, 436, 395/484, 492; 365/154, 156, 189.12, 227, 230.03; 711/104, 109, 157, 165, 5; 713/320; 712/239, 233; 105/5

(56) References Cited

U.S. PATENT DOCUMENTS

| | | | |
|---|---|---|---|
| 5,245,575 | * | 9/1993 | Sasaki et al. .................... 365/189.12 |
| 5,287,485 | * | 2/1994 | Umina et al. ........................ 711/165 |
| 5,532,958 | * | 7/1996 | Jiang et al. ........................... 365/154 |
| 5,539,691 | * | 7/1996 | Kozaru ............................ 365/189.05 |
| 5,557,225 | * | 9/1996 | Denham et al. ...................... 327/199 |
| 5,603,009 | * | 2/1997 | Konishi et al. ...................... 711/165 |

* cited by examiner

Primary Examiner—Glenn Gossage
(74) Attorney, Agent, or Firm—Blakely, Sokoloff, Taylor & Zafman LLP

(57) ABSTRACT

A memory device including an array of memory cells and a method for copying information within the memory device. Each memory cell includes a first memory sub-cell and a second memory sub-cell. Each memory cell also includes a device that copies information from the first memory sub-cell into the second memory sub-cell. Each memory cell may include a static random access memory (SRAM) cell and may utilize tri-state inverters to make overwriting information easier and reduce power consumption. Each memory cell may also include a second copy device that allows information to be copied from the second memory sub-cell to the first memory sub-cell. The memory device may be provided in a register file of a microprocessor to copy information from an architectural branch register (ABR) file to a speculative branch register (SBR) file.

25 Claims, 6 Drawing Sheets

MEMORY DEVICE FOR A MICROPROCESSOR REGISTER FILE HAVING A POWER MANAGEMENT SCHEME AND METHOD FOR COPYING INFORMATION BETWEEN MEMORY SUB-CELLS IN A SINGLE CLOCK CYCLE

BACKGROUND OF THE INVENTION (1) Field of the Invention

The present invention relates generally to the field of electronic storage devices. More specifically, the present invention relates to storing and transferring information onto electronic storage devices.

(2) Description of the Related Art

Electronic storage devices are well known in the art. Typically, such devices are used for storing information therein and retrieving information therefrom when desired. Data is written into or read from these devices, generally, under the control of a processor. The processor, typically, sends a control signal to a storage device indicating what operation will be performed in conjunction with that storage device, i.e., a read or a write operation. An address bus coupled between the processor and the storage device allows the processor to drive the storage device with an address signal pointing to a specific storage location in conjunction with which a read or a write operation is to be performed. Data is then transferred to/from the storage device via a data bus depending on whether a write or a read operation is being performed.

FIG. 1 is an example of a prior art processor 102 coupled to two memory devices 104 and 116. The memory device 104 is coupled to the processor via a control line 108, address bus 110, and data bus 112. A clock 114 sequences the operation of the processor, of the memory device 104, and of a second memory device 116. The second memory device 116 is coupled to the processor via address bus 110, data bus 112, and control line 108. When it is desired to copy information from one memory onto the other memory, the processor accesses the respective memory location storing the information to be transferred, fetches that information and copies it onto the other memory device. The configuration shown in FIG. 1, however, is limited to the copying of only one quantum of data, such as a byte, word, or a quad word, in one clock cycle, as generally data bus 112 is physically limited to 16, 32, or 64 bits.

In some cases, it is desirable to copy the entire information stored in a storage device such as a memory, cache, register file, or the like, onto another storage device. For example, in a microprocessor executing instructions speculatively it is often desirable to have "architectural" information stored in a first storage device and "speculative" information stored into a second storage device. "Architectural information" is herein defined as information that the processor produces and stores when executing instructions without performing or using branch prediction. The architectural information is validated information and, hence, by definition, is always correct. "Speculative information" is herein defined as estimated information that the processor produces and stores when executing instructions in the path of a predicted branch. The speculative information is generally generated in response to a speculative prediction which is found to be either correct or incorrect during a validation stage which occurs later in a processor's pipeline. The speculative information is, thus, unvalidated and may be incorrect until validation. If the prediction, however, is found to be correct, the speculative information is identical to the architectural information. When the speculative information is found to be incorrect during the validation stage, it is necessary to copy, in a very short time, such as one clock cycle, the entire architectural information onto the device storing the speculative information. The implementation of such features requires two memory storage arrays that can operate independently and a means for expeditiously copying information from one array to the other array in preferably one clock cycle.

One solution to this problem would be routing data and control lines from each storage cell, of the first storage device, to a corresponding cell of the second storage device. Such configuration, however, is very difficult to implement and is essentially undesirable as it requires a relatively large silicon area. This configuration also negatively affects the performance of the storage devices by increasing the capacitance, resistance, and inductance of the lines, thereby decreasing the speed of the storage device.

What is needed then is a device capable of copying information from a first storage area onto a second storage area without incurring the overhead posed by routing relatively long conductors from each storage cell of the first storage area to a corresponding storage cell of the second storage area.

BRIEF SUMMARY OF THE INVENTION

The present invention provides a memory device including an array of memory cells. Each cell includes a first memory sub-cell and a second memory sub-cell. The memory device also includes a device that copies information from the first sub-cell onto the second sub-cell.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one of ordinary skill in the art will recognize that the invention may be practiced without these specific details. In some instances, well-known circuits, structures, and techniques have not been shown in detail to avoid obscuring the present invention.

Figure 1:
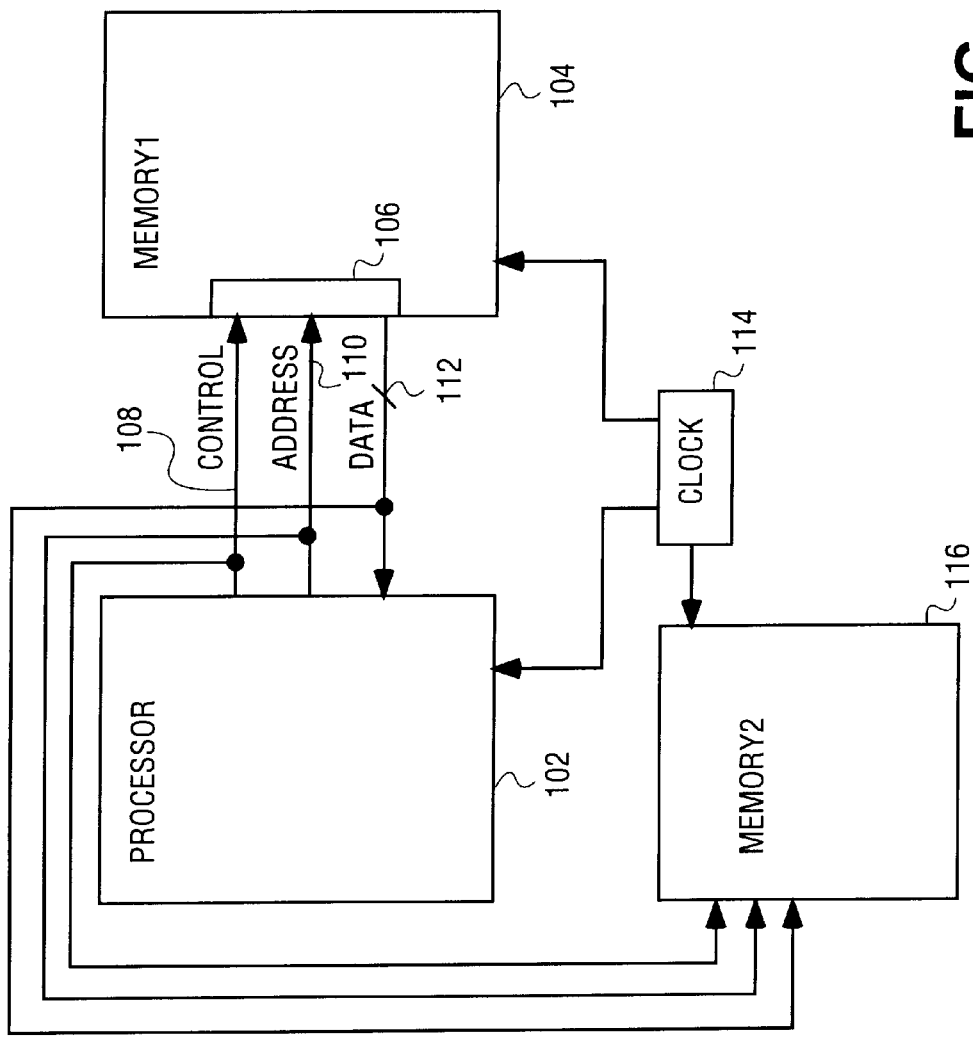
FIG. 1 is a prior art block diagram of a processor coupled to two memory devices.
Figure 2:
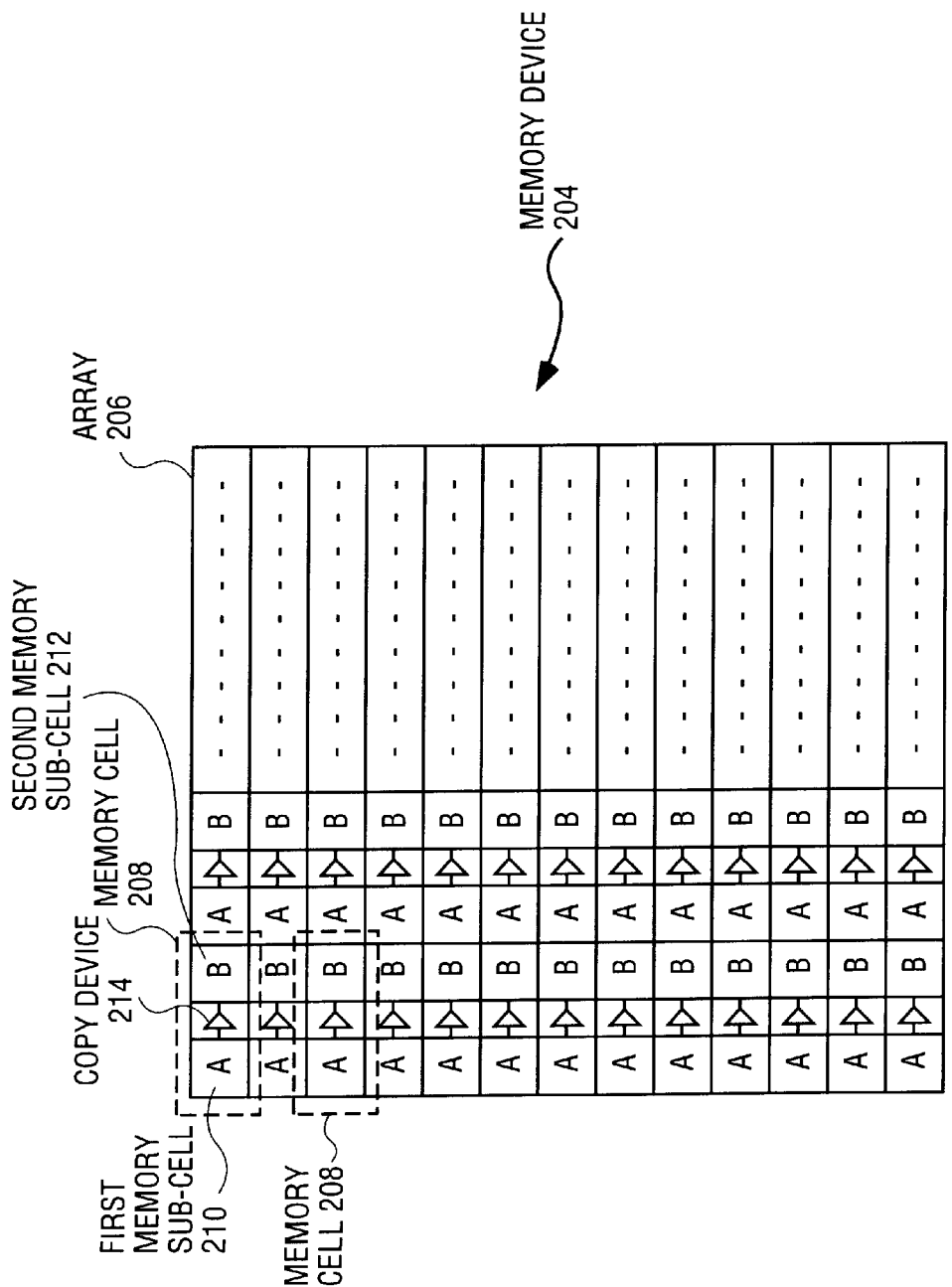
FIG. 2 illustrates a storage array device according to the present invention.

FIG. 2 illustrates a storage array memory device 204 according to the present invention. Such storage array memory device can be, by way of non-limiting example, a memory, a cache, a register file in a microprocessor, or the like. The memory device 204 includes an array 206 with a plurality of memory cells 208 (shown in dotted lines) for storing information. Each memory cell 208 includes a first memory sub-cell 210 (type A sub-cell) and a second memory sub-cell 212 (type B sub-cell). The memory sub-cells 210 and 212 have substantially the same structure. Each such sub-cell can be, by way of non-limiting example, a static random access memory (static RAM or SRAM) cell. The type of sub-cells 210 and 212, i.e., type A and type B, respectively, does not characterize the structure of the cells but rather the type of information which is generally stored onto these sub-cells. Information of a first type can thus be stored in sub-cells 210 by selecting one or more consecutive sub-cells 210 of the same type, of a specific row and writing to those sub-cells. "Consecutive sub-cells" herein means sub-cells of a same type having only one sub-cell of a different type placed therebetween. Sub-cells 212 generally store information of a different type than the information stored in sub-cells 210.

In this particular embodiment illustrated in FIG. 2, the memory sub-cells A and B are aligned column-wise. Each column includes a plurality of contiguous memory sub-cells 210 (type A) or memory sub-cells 212 (type B). Also each column including sub-cells for storing information of a particular type (A or B) is adjacent to another column including sub-cells for storing information of the other type, i.e., B or A, respectively. In other words, memory sub-cells 210 and 212 are interleaved column-wise. In another embodiment, memory sub-cells 210 and 212 can also be interleaved row-wise.

A copying device 214, disposed within each memory cell 208, is used for copying information from a type A sub-cell onto the corresponding type B sub-cell included in the same memory cell 208. The copying device 214 can be, by way of non-limiting example, a tri-state buffer having a control input coupled to a first copy line (not shown). The first copy line (not shown) can be routed to all copying devices of the array 206 to provide simultaneous copying of information from type A sub-cells onto the type B sub-cells in one clock cycle. The first copy line (not shown) can be coupled to a controlling device such as a microprocessor (not shown), if the array 206 is outside of the microprocessor, or to a particular control unit within the microprocessor, if array 206 is disposed within the microprocessor. The controlling device can drive the copy line with a copy signal enabling the copying of information as set forth above. The copying device 214 can also be a bi-directional tri-state buffer allowing copying information from a type A sub-cell onto a type B sub-cell and vice-versa. The interleaved array 206 with the copying device 214 disposed within each memory cell 208 avoids the routing of conductors from each storage cell of one array to another storage cell of another array thereby overcoming the above-mentioned shortcomings associated with such routing of conductors.

Figure 3:
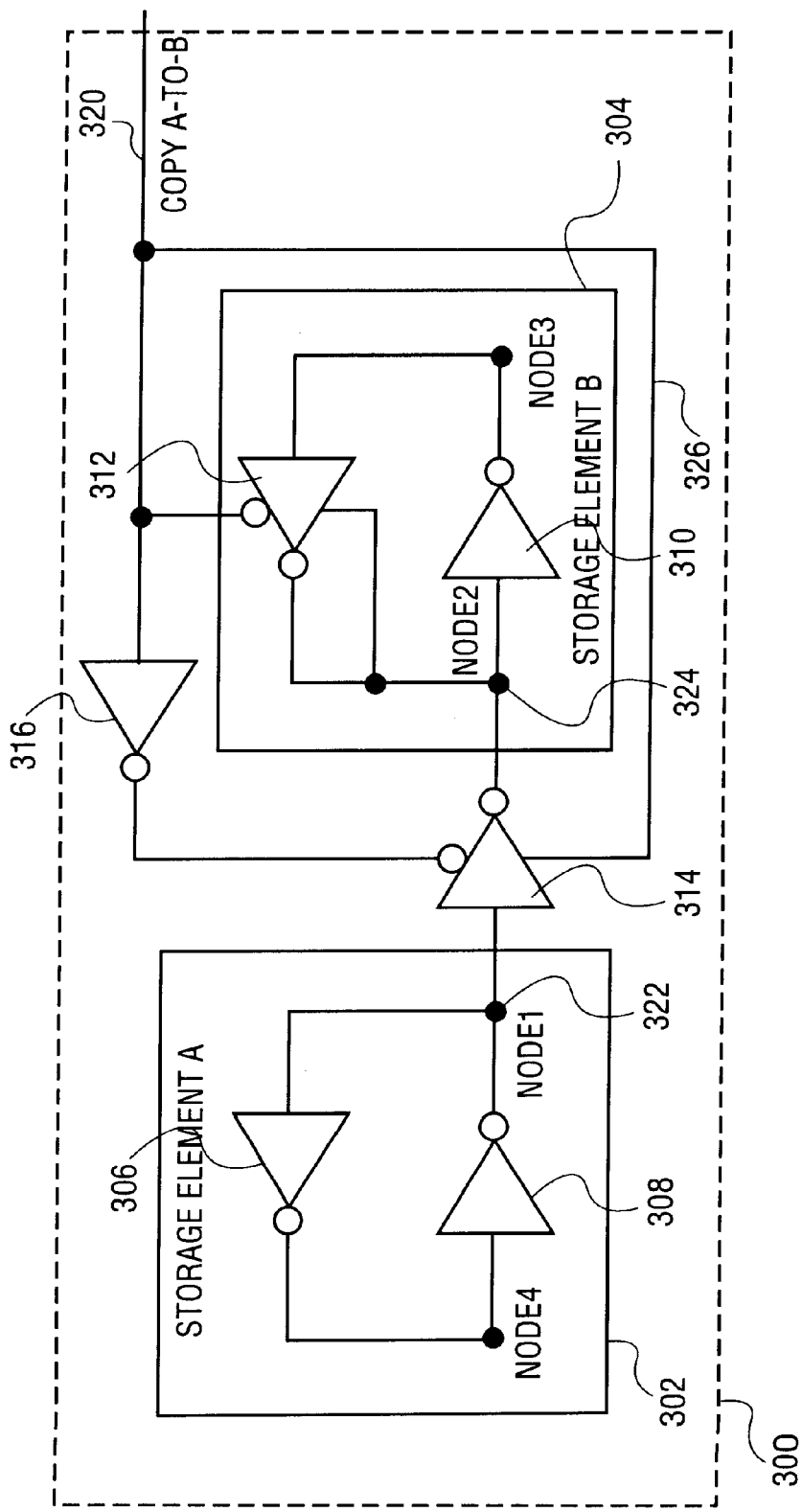
FIG. 3 illustrates in more detail a cell of a memory device according to the present invention.

FIG. 3 illustrates in more detail a memory cell 300 of the memory device according to the present invention. Memory cell 300 includes a memory sub-cell 302 (type A sub-cell) and a second memory sub-cell 304 (type B sub-cell). Memory cell 300 also includes a copying device 314 coupled to both sub-cell 302 and sub-cell 304. Sub-cells 302 and 304 can be, by way of non-limiting example, SRAM memory cells with cross-coupled inverters, 308 and 306, and 310 and 312 respectively, coupled as shown in FIG. 3. Information is stored in each sub-cell by driving a wordline line (not shown) coupled to that respective sub-cell with a high signal and then latching information from a bitline (not shown) onto that sub-cell. Each sub-cell of a specific type has a different mechanism for selecting and reading/writing from/to that sub-cell than the sub-cells of another type.

Typically, when it is determined that the information stored in storage element A needs to be copied onto storage element B, a first copy signal is driven via line 320 to an input of inverter 316. An inverted copy signal, generated at an output of inverter 316, is driven to a control input of the copying device 314. The copying device 314 is a tri-state buffer having an input coupled to node 1 of the sub-cell 302. Copying device 314 has an output coupled to a node 2 of sub-cell 304. Moreover, copying device 314 has a control input driven by the inverter 316 with the inverted copy signal. Copying device 314 has another control input driven by the first copy signal itself. When a copy signal set to high or logic 1 is driven via line 320, the tri-state buffer 314 is enabled thereby transferring the information included in sub-cell 302 onto sub-cell 304. However, to avoid unnecessary power dissipation in the memory cell 300, during the transfer of information from sub-cell 302, each memory cell 300 includes a power management scheme incorporated therein. In the embodiment illustrated in FIG. 3, the upper inverter 312 of sub-cell 302 is tri-stated by the same first copy signal driven via line 320. This power management scheme is directed to avoiding prohibitively large power consumption that otherwise would be caused by the fact that when driving information from sub-cell 302 to sub-cell 304, the buffer 314 would have to override the current driven via inverter 312 when the two sub-cells store different information, i.e., logic '0' and logic '1'.

Figure 4:
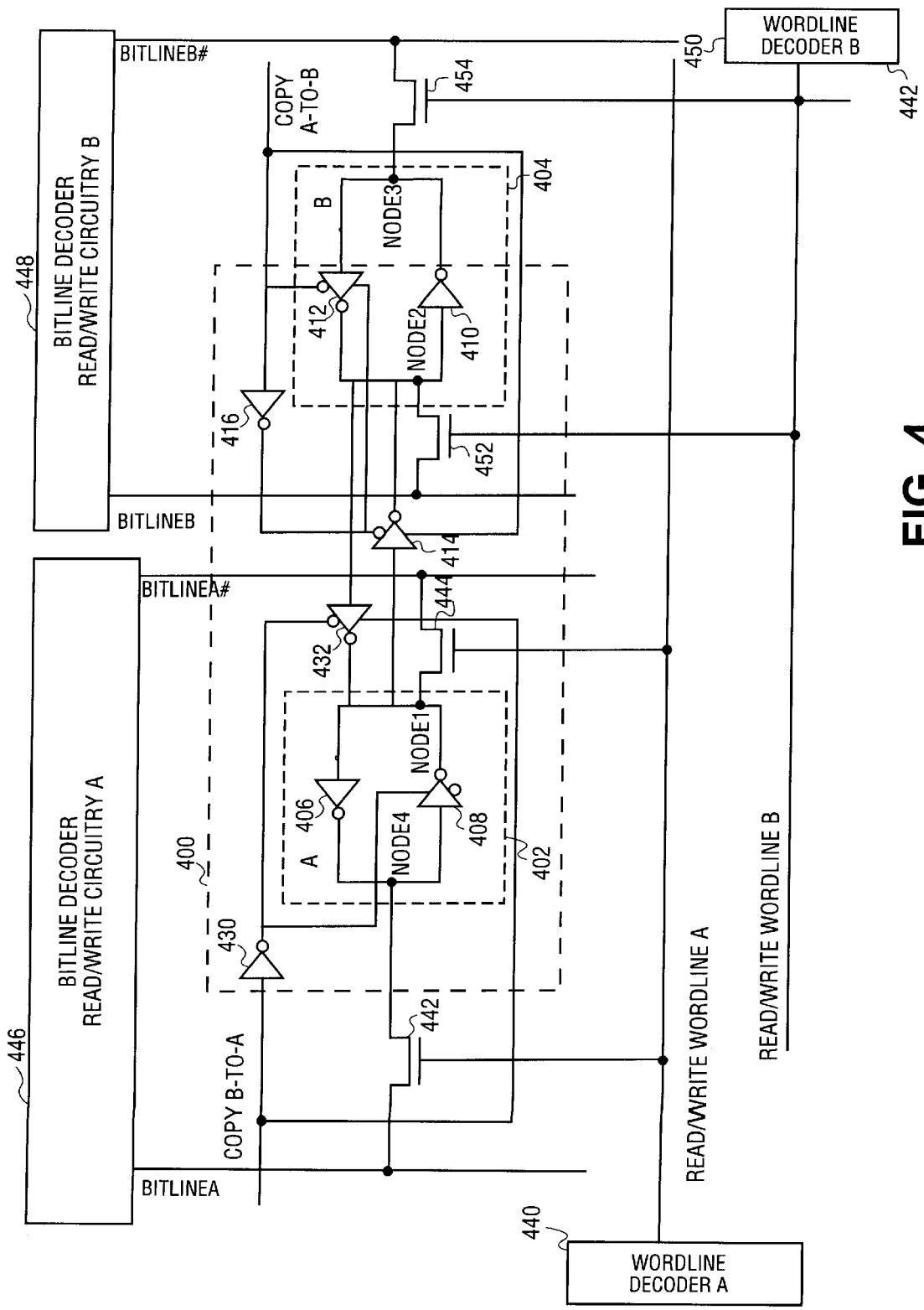
FIG. 4 illustrates a cell of a memory device with a bi-directional copy mechanism and coupled to read/write and decode circuitry according to the present invention.

FIG. 4 illustrates a block diagram for a memory cell, of an array, with a bi-directional copy mechanism according to the present invention. The memory cell 400 is similar to the memory cell 300 illustrated in FIG. 3 with the exception of an additional copying circuit (hereinafter, "copy B-to-A circuit") which includes inverter 432 and 430 coupled to a second copy line (copy B-to-A line). When it is desired to copy information from sub-cell 402 onto sub-cell 404 the copy A-to-B line is driven with a high signal. Tri-state inverter 414 is enabled such that data is copied from sub-cell 402 onto sub-cell 404 via inverter 414. When, however, it is desired to copy information from sub-cell 404 onto sub-cell 402 the copy B-to-A line is driven with a high signal such that tri-state inverter 432 is enabled. Data is then transferred from sub-cell 404 onto sub-cell 402 via the inverter 432. However, when it is not desired to copy information from one sub-cell onto the other sub-cell coupled thereto, then both lines copy A-to-B and copy B-to-A are low such that inverters 432 and 414 are tri-stated. With the inverters 432 and 414 tri-stated, there is no electrical conductivity between sub-cells 402 and 404. Note that the lines copy A-to-B and copy B-to-A are never active or activated (high) at the same time, as this could cause collision of data in the sub-cells 402 and 404.

The memory cell 400 has a power management circuit which includes tri-state inverters 412 and 408 coupled to the copy A-to-B line and to the copy B-to-A line, respectively. Assuming that the line copy A-to-B is driven with a high signal for copying the storage cell A onto storage cell B and data at the input of the inverter 408 (NODE 4) is 1, the output of inverter 408 (NODE 1) will be set at logic level 0. As the tri-state inverter 414 is enabled, a "1" is forced onto node 2, which is the output of tri-state inverter 414, and the input of inverter 410. Assuming that tri-state inverter 412 were a regular inverter (not tri-stated), and that before copying data from sub-cell 402 onto sub-cell 404, each of these sub-cells would contain different data, inverter 412 would pull node 2 down to the lower rail (ground), while the tri-state inverter 414 would pull node 2 up to the upper rail $V_{DD}$. The inverter 414 would then be required to have larger transistors capable to source enough current to overcome the effect of inverter 412. A prohibitive amount of power would then be dissipated in the cell 400. However, by having inverter 412 tri-stated, redundant power dissipation is avoided. Once the sub-cell 404 is "written" with data from sub-cell 402, the COPY A-to-B signal is set to 0 such that the copying device is cut-off while the inverter 412 reverts to normal operation.

The memory device according to the present invention includes a first circuit (440 and 446) for selecting sub-cells of type A and writing or reading to those sub-cells. The memory device, according to the present invention, also includes a second circuit (442 and 448) for selecting sub-cells of type B and writing or reading to/from those sub-cells. This first circuit includes word line decoder 440 and bit line decoder and read/write circuitry A 446. The word line decoder A 440 is coupled via read/write word line A to all sub-cells of type A of a specific row of the array according to the present invention. The word line decoder A 440 has an output driving read/write word lines for every row, of the array, coupled to type A sub-cells. Once an address is sent to the word line decoder from a microprocessor (not shown) or from another control unit, the word line decoder A 440 decodes the respective address and drives a specific read/write word line A, corresponding to the decoded address, with a high signal. This signal biases access transistors 442 and 444, with a voltage high enough to allow these transistors to conduct.

MOS transistors 442 and 444 are coupled at their sources thereof to node 4 and node 1, respectively, of sub-cell 402. The drains of these transistors are coupled, via bitline A and via bitline A# respectively, to a bitline decoder and read/write circuitry 446 for sub-cells of type A. "Bitline A#" represents a line that drives the logic complement of the signal driven through "Bitline A." For each column of the memory array according to the present invention, circuitry 446 has a bitline and a bitline# routed to a sub-cell A belonging to that column. While the bitline A and bitline A# are common for all sub-cells corresponding to one single column, only one sub-cell is read from or written to at one time due to the fact that the word line decoder A 440 drives only the access transistors corresponding to a specific row with a high signal. The bitline decoder and read/write circuitry 446 can, thus, perform reading or writing from a specific sub-cell of type A by driving bitline A or bitline A# with appropriate signals.

FIG. 4 also shows the word line decoder B 450 coupled to sub-cell 404 via a read/write word line B and MOS transistors 452 and 454. The circuit for decoding a specific word line coupled to a sub-cell of type B is similar to the equivalent circuit including word line decoder A 440. Moreover, a bitline decoder and read/write circuitry 448, coupled to bitline B and bitline B#, is provided for sub-cells of type B. This circuitry is similar in structure to the circuit 446. The present invention thus provides for separate circuitry for accessing and for reading/writing from/to sub-cells of different types. Accordingly, reading from and writing to sub-cells of type A and B is performed independently.

Figure 5:
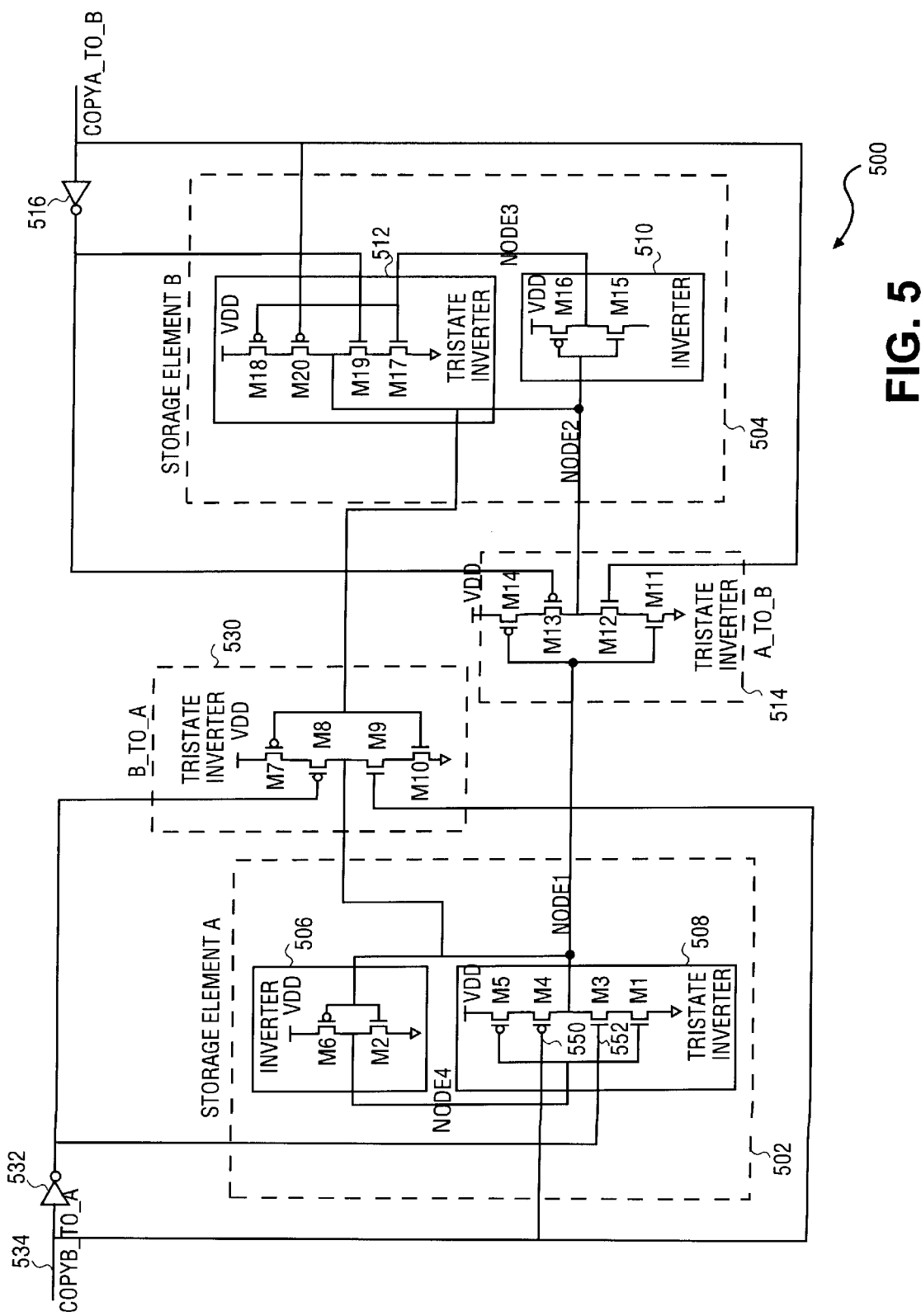
FIG. 5 illustrates a transistor-level diagram of the memory cell according to the present invention.

FIG. 5 illustrates a transistor-level diagram of the memory cell 500 according to the present invention. Sub-cell 502 (storage element A) includes an upper inverter 506 and a lower inverter 508. The lower inverter 508 is tri-stated having a control input coupled to the copy B-to-A line 534, and another control input coupled to the output of inverter 532. Storage element A is a static memory cell which does not require periodic signals to maintain data stored therein. The upper inverter 506 is a complementary metal oxide semiconductor (complementary MOS or CMOS) inverter including n-channel MOS (NMOS) transistor M2 and p-channel MOS (PMOS) transistor M6. Similarly, the lower inverter 508 is a CMOS inverter including the PMOS transistor M5 and the NMOS transistor M1. Additionally, the lower inverter 508 includes tri-state transistors M4 and M3 which are coupled to the copy B-to-A signal line and to the output of inverter 532, respectively. A copying device 514, which is a tri-state inverter, includes NMOS transistor M11 and PMOS transistor M14 coupled as shown in FIG. 5. Additionally, copying device 514 includes tri-state transistors M12 and M13 coupled to the copy A-to-B line and to the output of inverter 516, respectively.

A second copy device 530 for copying information from sub-cell 504 onto sub-cell 502 is provided in the memory cell 500. The second copy device 530 includes a CMOS inverter having NMOS transistor M10 and PMOS transistor M7 as shown in FIG. 5. Additionally, the second copying device 530 has tri-state transistors M8 and M9 coupled to the output of inverter 532 and to the copy B-to-A signal, respectively.

Sub-cell 504 includes a lower inverter 510 and an upper inverter 512. Lower inverter 510 is a CMOS inverter which includes NMOS transistor M15 coupled to PMOS transistor M16 as shown in FIG. 5. Additionally, sub-cell 504 includes an upper inverter 512. The upper inverter 512 includes a CMOS inverter with NMOS transistor M17 and PMOS transistor M18 as shown in FIG. 5. Additionally, the upper inverter 512 includes tri-state transistors M19 and M20 coupled to the output of inverter 516 and to the copy A-to-B line respectively.

Figure 6:
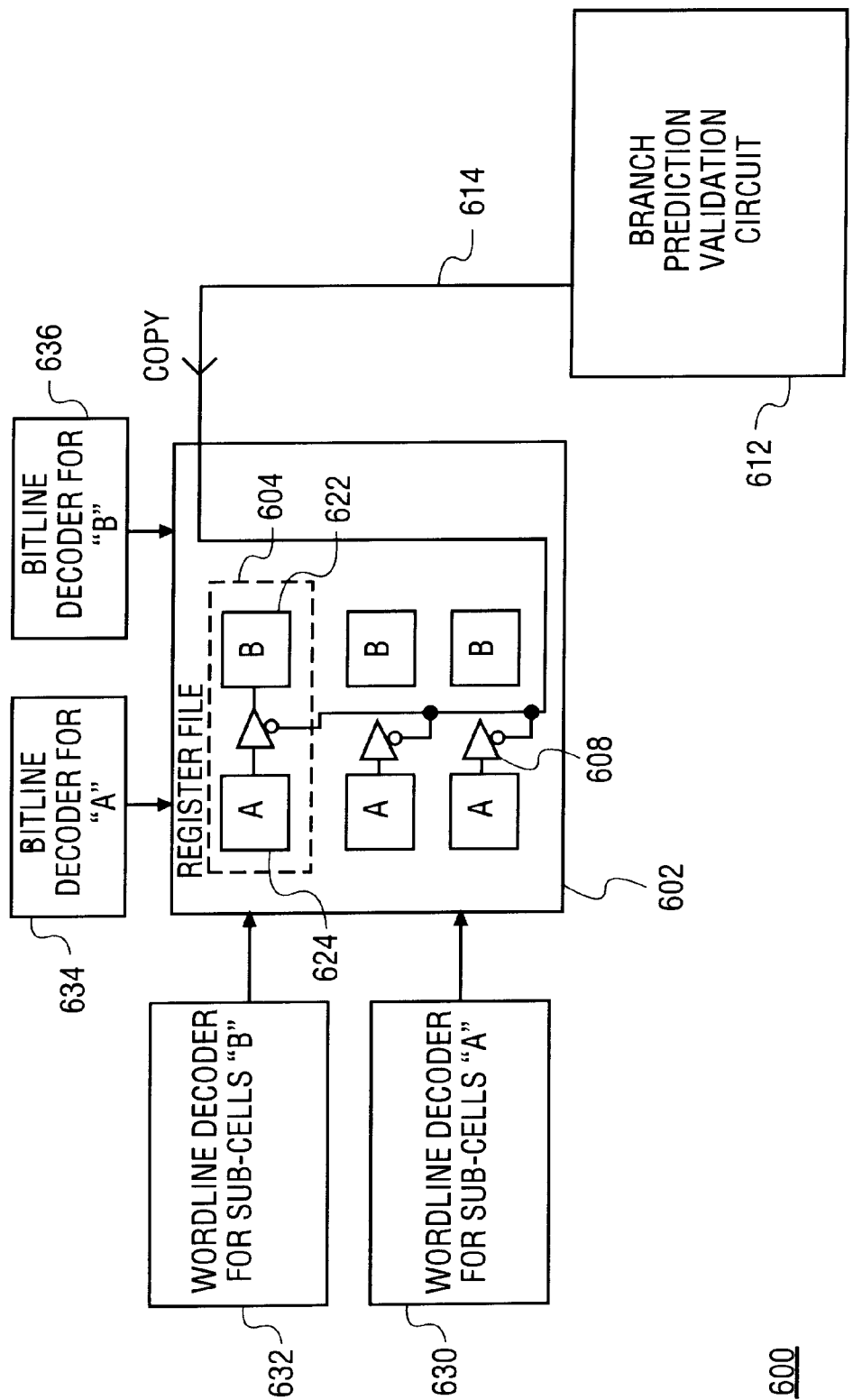
FIG. 6 illustrates a block diagram of a microprocessor with a register file according to the present invention.

FIG. 6 illustrates a block diagram of a microprocessor 600 including a register file 602 incorporating a plurality of memory cells 604 (shown in dotted lines) according to the present invention. Register file 602 is a storage array that includes a plurality of memory cells 604, much like the memory device described in conjunction with FIGS. 2–5. The register file 602 may have a smaller size than a typical memory device. In this particular implementation, each memory cell 604 includes sub-cells A and B. Memory sub-cells A and B store information of different types as explained above in conjunction with FIG. 2. In this particular example, sub-cells A can store architectural information while sub-cells B can store speculative information. For example, storage sub-cells A could include information related to an architecturally defined branch register file while the storage sub-cells B could include information related to a speculative instruction address register. In other words, the register file has an array with two interleaved sub-arrays: one such sub-array is a speculative instruction address register file while the other sub-array is a branch register file. For each memory cell 604, a copying device 608 is coupled between the two sub-cells A and B. Also, for each sub-cell A and B, a separate word line decoding circuitry 630 and 632, respectively, is provided. Moreover, separate bitline decoders and read/write circuitry 634 and 636 are provided for sub-cells A and sub-cells B respectively. The bitline decoders and read/write circuitry are coupled to sub-cells A and B as explained in conjunction with FIG. 4.

The microprocessor 600, performs target address branch prediction using speculative branch registers (SBR) which are made up of the sub-cells of type B. The microprocessor 600 also includes architectural branch registers (ABR) made up of the sub-cells A. The SBRs and ABRs include information related to branch target address, branch taken/not taken history, and other branch related information depending on the specific implementation. The speculative register, which contains the result of speculative execution, may need validation later. When the speculative register's contents are found to be incorrect during validation, the architectural branch prediction validation circuit 612, included in the microprocessor 600, drives a copy line 614, coupled thereto, with a copy signal set to a high voltage level. Architectural branch prediction validation circuit 612 is responsible for comparing a speculative prediction with a correct branch result to determine if the instruction after the branch instruction is valid and should be committed to architectural state.

Typically, when a branch instruction is encountered a prediction is made for the target and the direction of the branch. Since these branch instructions are fetched based on this predicted information, these instructions are speculative and may not be committed to architectural state until the branch prediction has been verified to be correct. If the prediction is determined to be incorrect, i.e., a branch misprediction, the SBR needs to be updated with the architecturally correct values from the branch register file. In this case the architectural branch prediction validation circuit 612 generates the copy signals for copying the architecturally correct values from the architectural branch register file (storage elements A) onto the speculative branch registers (SBRs) (storage element B) such that all storage sub-cells are copied at one time. The previous contents of the SBR (sub-cells B) are overwritten and lost while the contents of the architectural branch register file (sub-cells A) are not affected by this flash-copy operation. The above-presented discussion pertaining to FIGS. 2, 3, 4, and 5 is herein incorporated by reference with respect to the register file 602 and its access circuitry including read/write and decode circuitry.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A memory device comprising:
   an array of memory cells, each memory cell including a first memory sub-cell to store a plurality of architectural branching information, a corresponding second memory sub-cell to store a plurality of speculative branching information, a copying device to copy information from the first memory sub-cell onto the corresponding second memory sub-cell of each of the memory cells of said array of memory cells, and a power management circuit to conserve power when information is copied from the first memory sub-cell to the second memory sub-cell of each of the memory cells of said array of memory cells.

2. The memory device of claim 1 further including a second copying device to copy information from the second memory sub-cell onto the corresponding first memory sub-cell of each memory cell of said array of memory cells.

3. The memory device of claim 1 wherein, for each memory cell of said array of memory cells, the information copied from the first memory sub-cell onto the corresponding second memory sub-cell is copied in one clock cycle.

4. The memory device of claim 1 wherein said copying device includes a tri-state buffer.

5. The memory device of claim 1 wherein said first and second memory sub-cells are static RAM (SRAM) cells.

6. The memory device of claim 1 further comprising a first circuit to access and to read from and to write to the first memory sub-cells of each memory cell of said array of memory cells.

7. The memory device of claim 6 further comprising a second circuit to access and to read from and to write to the second memory sub-cells of each memory cell of said array of memory cells.

8. The memory device of claim 1 wherein said copying device is coupled to a copy line to receive a copy signal and responsive thereto to copy information from the first memory sub-cell onto the corresponding second memory sub-cell of each of the memory cells of said array of memory cells.

9. The memory device of claim 8 wherein said power management circuit includes first and second inverters coupled with each of the first and second memory sub-cells, respectively, and is responsive to a control input coupled to said copy line.

10. The memory device of claim 9 wherein the first inverters are tri-state inverters.

11. The memory device of claim 9 wherein the first and second inverters are tri-state inverters.

12. A microprocessor to process instructions speculatively, said microprocessor including a register file, said register file comprising:
    an array including a plurality of memory cells, each memory cell including a first memory sub-cell to store a plurality of architectural branching information, a corresponding second memory sub-cell to store a plurality of speculative branching information, a copying device to copy information from the first memory sub-cell onto the corresponding second memory sub-cell of each of the memory cells of said array of memory cells responsive to a branch prediction validation circuit, and a power management circuit to conserve power when information is copied from the first memory sub-cell to the second memory sub-cell of each memory cell of said array of memory cells.

13. The microprocessor of claim 12 wherein, for each memory cell of said array of memory cells, the information copied from the first memory sub-cell onto the corresponding second memory sub-cell is copied in one clock cycle.

14. The microprocessor of claim 12 further including a second copying device to copy information from the second memory sub-cell onto the first memory sub-cell of each memory cell of said array of memory cells responsive to the branch prediction validation circuit.

15. The microprocessor of claim 12 wherein the first and second memory sub-cells of each memory cell of said array of memory cells are static RAM (SRAM) cells.

16. The microprocessor of claim 12 further including a first circuit to access and to read from and write to the first memory sub-cell of each memory cell of said array of memory cells.

17. The microprocessor of claim 16 further comprising a second circuit to access and to read from and to write to the second memory sub-cell of each memory cell of said array of memory cells.

18. The microprocessor of claim 12 wherein said copying device is coupled to a copy line to receive a copy signal and responsive thereto to copy information from the first memory sub-cells onto the second memory sub-cells of each memory cell of said array of memory cells.

19. The microprocessor of claim 18 wherein said copying device includes a tri-state buffer with a control input coupled to said copy line.

20. The microprocessor of claim 18 wherein the branch prediction validation circuit is coupled to said copying device via said copy line, the branch prediction validation circuit generating a copy signal on said copy line when a branch misprediction is detected.

21. The microprocessor of claim 18 wherein said power management circuit includes first and second inverters coupled with each of the first and second memory sub-cells, respectively, and is responsive to a control input coupled to said copy line.

22. The microprocessor of claim 21 wherein the first inverters are tri-state inverters.

23. The microprocessor of claim 21 wherein the first and second inverters are tri-state inverters.

24. A memory device comprising:

an array of memory cells, each memory cell including a first memory sub-cell to store a plurality of architectural branching information and a corresponding second memory sub-cell to store a plurality of speculative branching information, the first memory sub-cell and the second memory sub-cell of each memory cell of said array of memory cells having a power management circuit associated therewith to conserve power when information is copied from the first memory sub-cell to the corresponding second memory sub-cell;

a copying device to copy information from the first memory sub-cell onto the corresponding second memory sub-cell of each memory cell of said array of memory cells responsive to a branch prediction validation circuit; and circuitry to separately access each of the first and second memory sub-cells of each memory cell of said array of memory cells.

25. A method for copying information within a memory device, the memory device having an array of memory cells, each memory cell including a first memory sub-cell to store a plurality of architectural branching information, a corresponding second memory sub-cell to store a plurality of speculative branching information and a copying device, the method comprising:

coupling a first memory sub-cell to a second memory sub-cell via the copying device;

coupling said copying device to a copy line;

driving said copy line with a copy signal to copy information from the first memory sub-cell onto the corresponding second memory sub-cell in each of the memory cells of said array of memory cells responsive to a branch prediction validation circuit; and conserving power consumption when information is copied from the first memory sub-cell to the corresponding second memory sub-cell of each memory cell of said array of memory cells.

* * * * *